United States Patent
Walter

(10) Patent No.: US 10,211,628 B2
(45) Date of Patent: Feb. 19, 2019

(54) PROTECTIVE CIRCUIT FOR A SIGNAL OUTPUT STAGE IN EVENT OF FAULTY CONTACTING OF ELECTRICAL CONNECTIONS

(71) Applicant: IFM ELECTRONIC GMBH, Essen (DE)

(72) Inventor: Heinz Walter, Hergatz (DE)

(73) Assignee: IFM ELECTRONICS GMBH (DE)

( * ) Notice: Subject to any disclaimer, the term of this patent is extended or adjusted under 35 U.S.C. 154(b) by 264 days.

(21) Appl. No.: 14/783,090

(22) PCT Filed: Apr. 10, 2014

(86) PCT No.: PCT/EP2014/057293
§ 371 (c)(1),
(2) Date: Oct. 8, 2015

(87) PCT Pub. No.: WO2014/167064
PCT Pub. Date: Oct. 16, 2014

(65) Prior Publication Data
US 2016/0049785 A1    Feb. 18, 2016

(30) Foreign Application Priority Data

Apr. 11, 2013  (DE) .................. 10 2013 206 412

(51) Int. Cl.
*H02H 9/02* (2006.01)
*H01L 27/02* (2006.01)

(52) U.S. Cl.
CPC ........... *H02H 9/02* (2013.01); *H01L 27/0259* (2013.01)

(58) Field of Classification Search
CPC .......... H02H 9/02; H02H 9/025; H02H 9/001; H02H 3/025; H02H 3/087; H02H 9/04;
(Continued)

(56) References Cited

U.S. PATENT DOCUMENTS 3,557,383 A * 1/1971 Wavre ................. H03K 19/084
                                                    326/130
3,609,479 A * 9/1971 Lin ..................... H01L 21/8248
                                                    148/DIG. 151
(Continued)

FOREIGN PATENT DOCUMENTS

DE    102013108302 A1   2/2014
EP        2051370 A2    4/2009

OTHER PUBLICATIONS (Analog Devices, Inc [online]. pdf.datasheet.live [retrieved on Nov. 21, 2007]. Retrieved from the Internet: <URL: https:http://pdf.datasheet.live/datasheets-1/analog_devices/AD5410BREZ.pdf>.*

*Primary Examiner* — Thienvu Tran
*Assistant Examiner* — Nicolas Bellido
(74) *Attorney, Agent, or Firm* — Schmeiser, Olsen & Watts, LLP

(57) ABSTRACT

A protective circuit for protecting an output stage in the event of faulty contacting of the electrical connections, wherein the output stage includes a driver unit and has an analog or digital signal output is provided. Accordingly, in order to protect the output stage from a faulty connection in a simple and economical manner, the protective circuit comprises a first transistor circuit, which is connected in series between the output stage and the signal output, and a second transistor circuit, which is connected in series between the negative supply connection and the signal output. The second transistor circuit is connected to the base of the first transistor circuit in order to influence the first transistor circuit in such a way that the first transistor circuit becomes highly resistive in the event of a fault.

12 Claims, 2 Drawing Sheets

Figure 1:
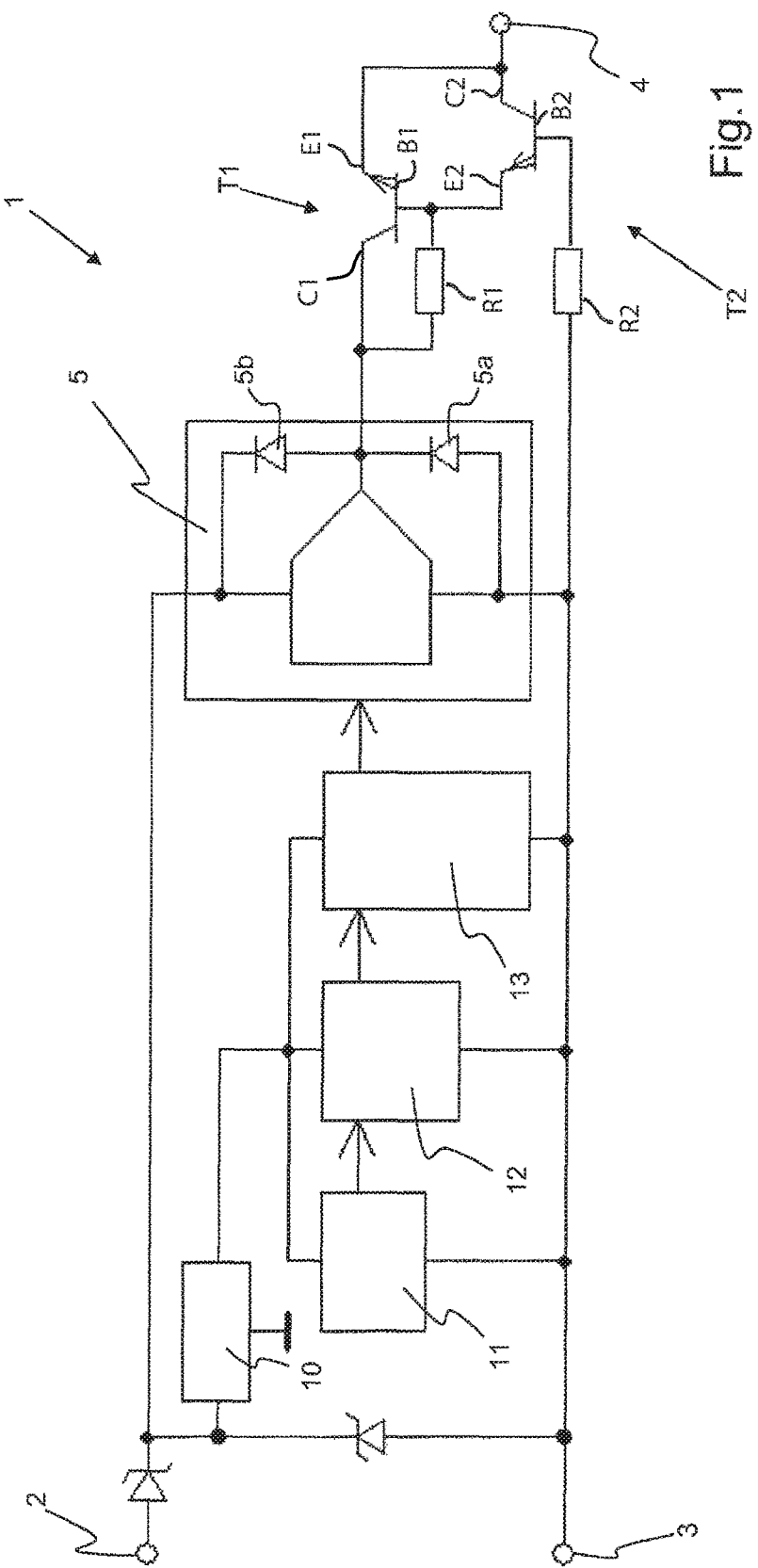

(58) Field of Classification Search
CPC . H02H 3/20; H02H 3/202; H02H 3/22; H01L
27/0259; H01L 27/02; H03F 3/20; H03F
3/34; H03F 3/45; H03F 3/343
USPC .............. 361/58, 91.1, 54; 340/653; 307/12;
257/355
See application file for complete search history.

(56) References Cited

U.S. PATENT DOCUMENTS

| | | | | |
|---|---|---|---|---|
| 3,896,317 | A | * | 7/1975 | Alcorn ................ H01L 27/0658 257/E27.021 |
| 4,161,760 | A | * | 7/1979 | Valentine ................ G05F 1/573 327/583 |
| 4,586,000 | A | * | 4/1986 | Wagner ................ H03F 3/3044 330/252 |
| 4,757,276 | A | * | 7/1988 | Ishii ........................ H03D 7/12 330/277 |
| 5,448,441 | A | | 9/1995 | Raposa |
| 5,793,596 | A | | 8/1998 | Jordan et al. |
| 2002/0036326 | A1 | * | 3/2002 | DeJong ..................... G05F 3/30 257/369 |
| 2002/0075614 | A1 | * | 6/2002 | Li ........................ H02H 9/046 361/56 |
| 2002/0097082 | A1 | * | 7/2002 | Vashchenko ........ H01L 27/0259 327/310 |
| 2002/0196007 | A1 | * | 12/2002 | Descombes ............. G05F 1/565 323/313 |
| 2003/0112566 | A1 | * | 6/2003 | Chilcote ............ H03K 17/0826 361/88 |
| 2004/0052022 | A1 | * | 3/2004 | Laraia ................. H01L 27/0285 361/91.1 |
| 2004/0114288 | A1 | * | 6/2004 | Cheng ................. H01L 27/0259 361/56 |
| 2007/0145484 | A1 | * | 6/2007 | Hosokawa .......... H01L 27/0259 257/355 |
| 2009/0141412 | A1 | * | 6/2009 | Hickam .................... H02H 3/14 361/54 |
| 2012/0092732 | A1 | * | 4/2012 | Nakazawa ............. H04N 1/00928 358/474 |
| 2014/0176017 | A1 | * | 6/2014 | Kuang ............... H05B 33/0824 315/307 |

* cited by examiner

PROTECTIVE CIRCUIT FOR A SIGNAL OUTPUT STAGE IN EVENT OF FAULTY CONTACTING OF ELECTRICAL CONNECTIONS

CROSS-REFERENCE TO RELATED APPLICATIONS

This application claims priority to PCT Application No. PCT/EP2014/057293, having a filing date of Apr. 10, 2014, based on DE 10 2013 206 412.8, having a filing date of Apr. 11, 2013, the entire contents of which are hereby incorporated by reference.

FIELD OF TECHNOLOGY

The following relates to a protective circuit for protecting an output stage in the event of faulty contacting of the electrical connections, wherein the output stage consists of a driver circuit and an analog or digital signal output.

BACKGROUND

In automation and process engineering frequently sensors or measuring devices are used, which convert detected measurement values—such as pressure, temperature, flow rate as well as distance and vibration—into an output signal representing this measurement value in the form of an analog current or voltage signal and provide this signal at their cable port or plug connection for further processing, such as a PLC. In order to enable that these signals can be evaluated, they previously have to be amplified, which usually takes place in a driver stage, which is arranged as a separate or combined chip on the circuit board in the sensor housing. Such a chip is, for example, the device AD5410 from Analog Devices.

However, these output stages can easily be destroyed in the event of an incorrect connection. The ESD protection diodes obligatory integrated at the driver output act as intended against voltage transients, which the driver output can be exposed even during normal handling by being led out from the sensor. If, however, the negative voltage supply connection (=ground) is connected to the positive supply voltage (UB+) and the output terminal is connected to the negative supply voltage (UB−), a short-circuit current flows through the ESD protection diode which is connected between ground and driver output. Moreover, measuring devices with high operating current consumption can be destroyed if the negative supply connection is not connected, since the entire operating current of the device flows through the ESD protection diode and simulates a proper connection by the thus seemingly correct function, until the ESD protection diode is destroyed due to overload.

A possible solution envisages to connect a sufficiently powerful protection diode in parallel to the analog output against ground and to provide a resistor between the output stage and the actual signal output which limits the current in case of short-circuit. To this end, the resistance must not be particularly highly resistive such as not to increase too much the resulting voltage drop in normal operation, however, it must have a certain performance class in order to withstand the heat generated by the short-circuit current. However, such devices are large and expensive, such that their installation is difficult and uneconomical.

From US 2007/0145484 A1 it is known to achieve ESD protection by a protection transistor that is connected in parallel with the output stage transistor. The US 2009/0141412 A1 reference relates to an interface, where the interface system is used to connect an electrical device to an electrical bus. By means of a special circuit current is prevented from flowing from the electrical device to the electrical bus when the power source is disconnected from the electrical bus.

SUMMARY

An aspect relates to an output stage in a simple and cost-efficient manner against a faulty connection.

As already stated above, the ESD protection diodes integrated on the chip are not sufficiently robust to withstand the mentioned cases of failure without damage or destruction. Accordingly, it is the gist of the embodiments of the invention to supplement the driver stage such that in the event of faulty contacting the electrical connections the output stage is protected.

To this end, the circuit provided to protect an output stage consisting of a driver unit and an analog or digital signal output in the event of faulty contacting the electrical connections according to the embodiments of the invention comprises a first transistor where the collector is connected with the output stage and the emitter with the signal output, wherein a first resistor is connected between collector and base and a second transistor wherein the base is connected over a second resistor with the negative supply connection wherein the second transistor can be operated inversely or normally, so that either the collector in the inverse operation or the emitter in the normal operation is connected to the signal output. Here, said second transistor is connected in the inverse operation with the collector and in the normal operation with the emitter to the base of the first transistor in order to influence the first transistor in such a manner that it becomes highly resistive in the event of a failure.

The added transistor circuits thus provide an extension, which both may be integrated on the chip as well as be arranged outside of the chip.

Normally, the first transistor circuit is low resistive, so that nearly no voltage drop occurs across it. However, in the case of a faulty contacting of the electrical connections the second transistor circuit influences the first one such that it becomes highly resistive and thus provides a resistance which interrupts the current flow and thus protects the driver stage against the destruction caused by a short-circuit current.

In a preferred embodiment of the invention it is provided that the second transistor circuit is operated inversely, so that the emitter of the second transistor circuit is connected to the base of the first transistor circuit. This has the advantage that an inadvertently applied external voltage level does not result in a breaking-through of the base-emitter path of the transistor of the second transistor circuit at the signal output.

According to a further preferred embodiment of the invention it is provided that the signal output is implemented either as a voltage output of 0 to 10 V or as a current output of 4 to 20 mA. In case of a voltage output, however, a highly resistive feedback line to the driver unit is necessary.

BRIEF DESCRIPTION

Figure 2:
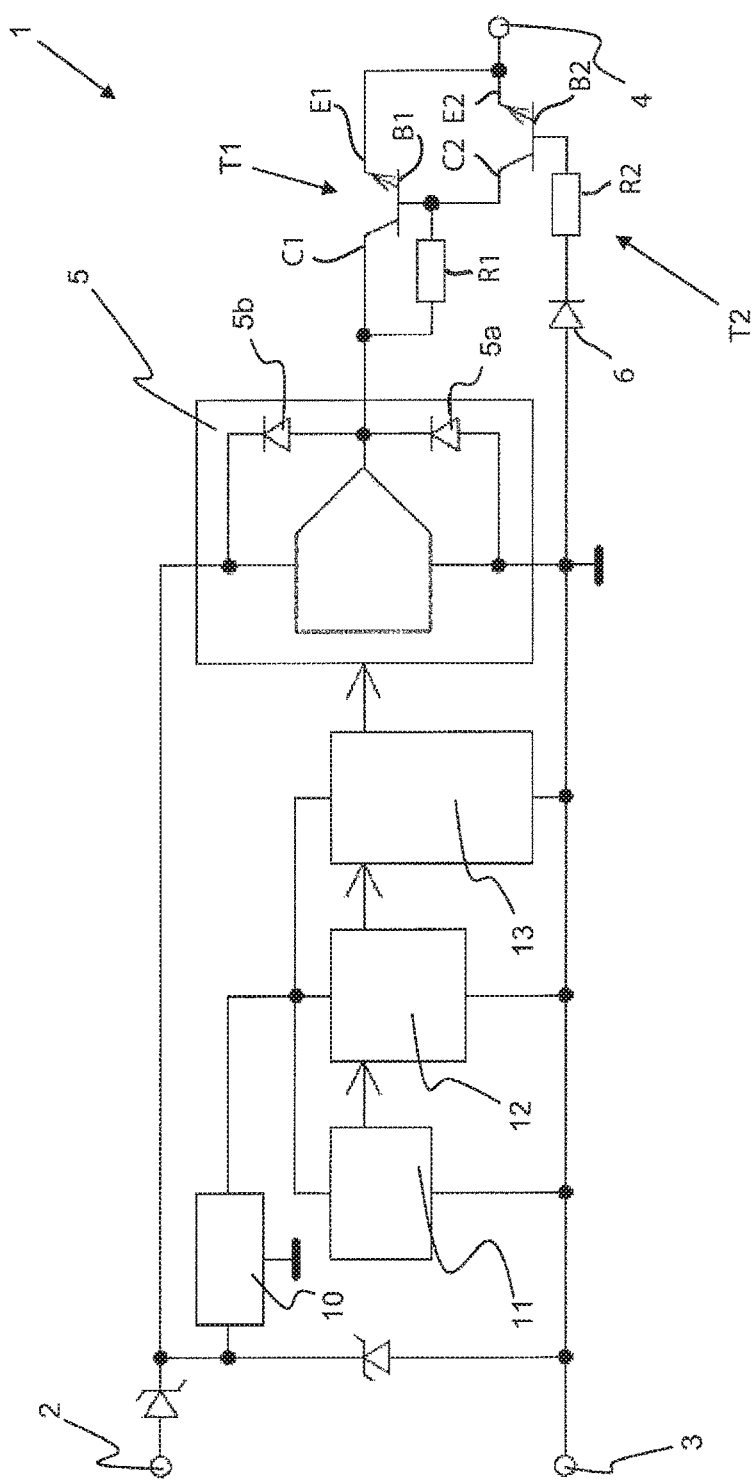

Some of the embodiments will be described in detail, with reference to the following figures, wherein like designations denote like members, wherein:

FIG. 1 is a sensor circuit comprising a protective circuit according to a first embodiment of the present invention; and FIG. 2 is a sensor circuit comprising a protective circuit according to a second embodiment of the present invention.

DETAILED DESCRIPTION

FIG. 1 shows a sensor circuit comprising a sensor element 11 including an integrated amplifier unit, an A/D-converter 12, a digital signal processor 13 for signal conditioning and a driver unit 5, which is addressed by the signal processor 13 via a digital protocol and comprises an integrated D/A-converter. At the positive supply connection 2 a voltage or linear regulator 10 is provided in addition to the two protection diodes, which are provided for the case of voltage reversal. The sensor element 11 is preferably configured as a vibration sensor, but can also be implemented to detect other conceivable measurement values as a pressure, temperature, flow rate or flow or as a distance sensor on an inductive, capacitive or optical basis. As described above, the sensor circuit may have a first transistor T1 and a second transistor T2. The first transistor T1 may have a collector C1, an emitter E1, and a base B1. In one embodiment, a first resistor R1 may be located between the collector C1 and the base B1. The second transistor T2 may have a collector C2, an emitter E2, and a base B2. In one embodiment, the second transistor T2 may include the base B2 connected over a second resistor R2 with a negative supply connection.

The sensor circuit is extended at the output of the driver stage 5 by the protection circuit 1 according an embodiment of the invention, which is arranged between the driver stage 5 and the analog signal output 4. The driver stage is preferably configured as AD5410 chip from Analog Devices. By means of the inverse operation of the second transistor circuit T2 the advantage is achieved that a voltage level inadvertently applied externally does not result in a breakdown of the base-emitter path of the transistor of the second transistor circuit T2 at the signal output 4.

The protection diode 5a integrated in the chip of the driver stage 5 acts only against voltage transients, which the analog output 4 may be exposed to even during normal handling by being led out of the sensor due to electrostatic discharge. If, however, the negative supply connection 3 is connected to the positive supply voltage (UB+) and the output terminal 4 is connected to the negative supply voltage (UB−) a short-circuit current flows through the ESD protection diode 5a which is connected in the forward direction between ground and analog output 4. In addition, destruction of measurement devices with high operating current consumption may occur if the negative supply connection 3 is not connected, since the entire operating current of the device flows through the ESD protection diode 5a and thus simulates a correct connection by the thus seemingly correct function, until the ESD protection diode 5a is destroyed due to overload.

In these cases, the second transistor circuit T2 influences the first transistor circuit T1 such that it becomes highly resistive while under normal circumstances it is low resistive. Thus, the short-circuit current is interrupted and the driver stage 5 is protected.

FIG. 2 shows a second embodiment of the protective circuit according to the invention. The difference with respect to the embodiment of FIG. 2 is that the second transistor circuit T2 is connected in normal operation, i.e. not inversely. The embodiment with an inverse transistor T2 can be operated only up to about 7 V, which at a current output of 20 mA corresponds to a load of 350 ohms. If a diode is connected in series to the base B2 of the second transistor T2, for example diode 6, it can be operated normally and voltages above 7 V are enabled and, thus, a higher load is possible. The advantage of the embodiment comprising an inverse transistor T2, however, is that the circuit in case of voltage reversal responds more sensitive than with a transistor T2 in normal operation.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A protective circuit for an output stage in event of faulty contacting of electrical connections, wherein the protective circuit has two configurations, a first configuration being an inverse operation, and a second configuration being a normal operation, wherein the output stage includes a driver unit, a positive supply connection, a negative supply connection, and an analog or digital signal output, wherein the faulty contacting of the electrical connections includes the negative supply connection is connected to a positive supply voltage, the protective circuit comprising:

a first transistor, where a collector of the first transistor is connected with the output stage and an emitter with the analog or digital signal output, wherein a first resistor is connected between the collector of the first transistor and a base of the first transistor, which is connected to a second transistor, further wherein a base of the second transistor is connected over a second resistor with the negative supply connection; wherein the second transistor is configured to operated inversely or normally, so that either a collector of the second transistor in the inverse operation or an emitter of the second transistor in the normal operation is connected to the analog or digital signal output, wherein, in the inverse operation, the emitter of the second transistor is connected to the base of the first transistor, and in the normal operation, the collector of the second transistor is connected to the base of the first transistor in order to influence the first transistor in such a manner that it becomes highly resistive in the event of a failure.

2. A protective circuit for an output stage in event of faulty contacting of electrical connections, wherein the protective circuit has two configurations, a first configuration being an inverse operation, and a second configuration being a normal operation, wherein the output stage includes a driver unit, a positive supply connection, a negative supply connection, and an analog or digital signal output, wherein the faulty contacting of the electrical connections comprises the negative supply connection not connected to ground, the protective circuit comprising:

a first transistor, where a collector of the first transistor is connected with the output stage and an emitter of the first transistor with the analog or digital signal output, wherein a first resistor is connected between the collector of the first transistor and a base of the first transistor, which is connected to a second transistor, further wherein a base of the second transistor is connected over a second resistor with the negative supply connection wherein the second transistor can be operated inversely or normally, so that either a collector of the second transistor in the inverse operation or an emitter of the second transistor in the normal operation is connected to the analog or digital signal output;

wherein, in the inverse operation, the emitter of the second transistor is connected to the base of the first transistor, and in the normal operation, the collector of the second transistor is connected to the base of the first transistor in order to influence the first transistor in such a manner that it becomes highly resistive in the event of a failure.

3. The protective circuit according to claim 2, wherein the signal output is configured as a voltage output of 0 to 10 V.

4. The protective circuit according to claim 2, wherein the signal output is configured as a current output of 4 to 20 mA.

5. The protective circuit according to claim 3, wherein the signal output is configured as a binary interface, in particular as a RS232 or RS485 interface.

6. A sensor circuit comprising: a sensor element, an amplifier unit, an A/D-converter, a digital signal processor, an output stage and an analog signal output, wherein the output stage comprises a driver unit which is addressed by the signal processor via a digital protocol and comprises an integrated D/A-converter, wherein, between the output stage and the signal output, a protective circuit according to claim 1 is arranged.

7. The protective circuit according to claim 1, wherein the signal output is configured as a voltage output of 0 to 10 V.

8. The protective circuit according to claim 1, wherein the signal output is configured as a current output of 4 to 20 mA.

9. The protective circuit according to claim 5, wherein the signal output is configured as a binary interface, in particular as a RS232 or RS485 interface.

10. The protective circuit according to claim 9, wherein the binary interface is a RS232 or RS485 interface.

11. The protective circuit according to claim 3, wherein the signal output is configured as a binary interface is a RS232 or RS485 interface.

12. A sensor circuit for comprising: a sensor element, an amplifier unit, an A/D-converter, a digital signal processor, an output stage and an analog signal output, wherein the output stage comprises a driver unit which is addressed by the signal processor via a digital protocol and comprises an integrated D/A-converter, wherein, between the output stage and the signal output, a protective circuit according to claim 2 is arranged.

* * * * *